United States Patent [19]
Wytman

[11] Patent Number: 5,772,773
[45] Date of Patent: Jun. 30, 1998

[54] CO-AXIAL MOTORIZED WAFER LIFT

[75] Inventor: Joe Wytman, Los Gatos, Calif.

[73] Assignee: Applied Materials, Inc., Santa Clara, Calif.

[21] Appl. No.: 650,198

[22] Filed: May 20, 1996

[51] Int. Cl.[6] .................................................. C23C 16/00
[52] U.S. Cl. ...................... 118/729; 187/268; 198/468.8; 414/935
[58] Field of Search .................................... 118/729, 730; 414/935, 939; 187/268; 198/468.8

[56] References Cited

U.S. PATENT DOCUMENTS

| | | | |
|---|---|---|---|
| 381,492 | 4/1888 | Blickensderfer et al. | 187/268 |
| 1,636,560 | 7/1927 | Hall | 451/430 |
| 1,849,348 | 3/1932 | Davis | 54/29 |
| 2,187,390 | 1/1940 | Anderson et al. | 187/268 |
| 2,471,955 | 5/1949 | Hatch | 178/268 |
| 2,500,175 | 3/1950 | Guthrie | 310/75 D |
| 3,211,478 | 10/1965 | Batzer | 285/328 |
| 4,022,939 | 5/1977 | Roth et al. | 427/251 |
| 4,226,208 | 10/1980 | Nishida et al. | 118/706 |
| 4,311,427 | 1/1982 | Coad et al. | 414/417 |
| 4,413,180 | 11/1983 | Libby | 250/236 |
| 4,519,138 | 5/1985 | Held | 33/32 R |
| 4,591,044 | 5/1986 | Ogami et al. | 198/356.3 |
| 4,616,860 | 10/1986 | Faria et al. | 285/336 |
| 4,681,773 | 7/1987 | Bean | 427/38 |
| 4,740,702 | 4/1988 | Huang et al. | 250/352 |
| 4,781,551 | 11/1988 | Harada et al. | 414/217 |
| 4,892,321 | 1/1990 | Colgate et al. | 277/165.5 |
| 4,944,860 | 7/1990 | Bramhall, Jr. et al. | 204/298.15 |
| 4,950,002 | 8/1990 | Hormansdorfer | 285/328 |
| 5,024,830 | 6/1991 | Linner | 424/3 |
| 5,060,354 | 10/1991 | Chizinsky | 29/25.02 |
| 5,130,585 | 7/1992 | Iwamatsu et al. | 310/59 |
| 5,135,635 | 8/1992 | Ikeda | 204/298.25 |
| 5,148,714 | 9/1992 | McDiarmid | 74/89.15 |
| 5,205,179 | 4/1993 | Schneider | 74/365 |
| 5,292,383 | 3/1994 | Maydan et al. | 156/345 |
| 5,314,574 | 5/1994 | Takahashi | 156/646 |
| 5,421,229 | 6/1995 | Grossmann et al. | 82/124 |
| 5,476,548 | 12/1995 | Lei et al. | 118/728 |
| 5,520,743 | 5/1996 | Takahashi | 118/730 |
| 5,630,881 | 5/1997 | Ogure et al. | 118/730 |
| 5,632,873 | 5/1997 | Stevens et al. | 204/298.15 |

FOREIGN PATENT DOCUMENTS

| | | |
|---|---|---|
| 0397029 | 5/1990 | European Pat. Off. . |
| 3-185824 | 8/1991 | Japan ..................... 414/939 |
| 4-123430 | 4/1992 | Japan ..................... 414/939 |
| 4-372150 | 12/1992 | Japan ..................... 414/935 |
| 735545 | 5/1980 | U.S.S.R. ................ 187/268 |

Primary Examiner—R. Bruce Breneman
Assistant Examiner—Jeffrie R. Lund
Attorney, Agent, or Firm—Fulbright & Jaworski, L.L.P.

[57] ABSTRACT

A heating and lifting mechanism for positioning a semiconductor wafer within a processing chamber is provided including a pedestal for supporting the wafer within the process chamber, a drive shaft extending downwardly from a lower region of the pedestal, which has a lead screw at a distal portion thereof, and a drive mechanism, which is coaxial with the drive shaft, for providing linear vertical translation of the shaft and pedestal. The device also includes a CONFLAT® assembly located between the pedestal and drive shaft. The CONFLAT® assembly includes upper and lower substantially flat planar plates removably connected to one another. The upper plate is connected to a lower region of the pedestal, and the lower plate is connected to an upper end of the drive shaft. The CONFLAT® assembly permits removal of the heater pedestal without removing the entire lift assembly.

20 Claims, 5 Drawing Sheets

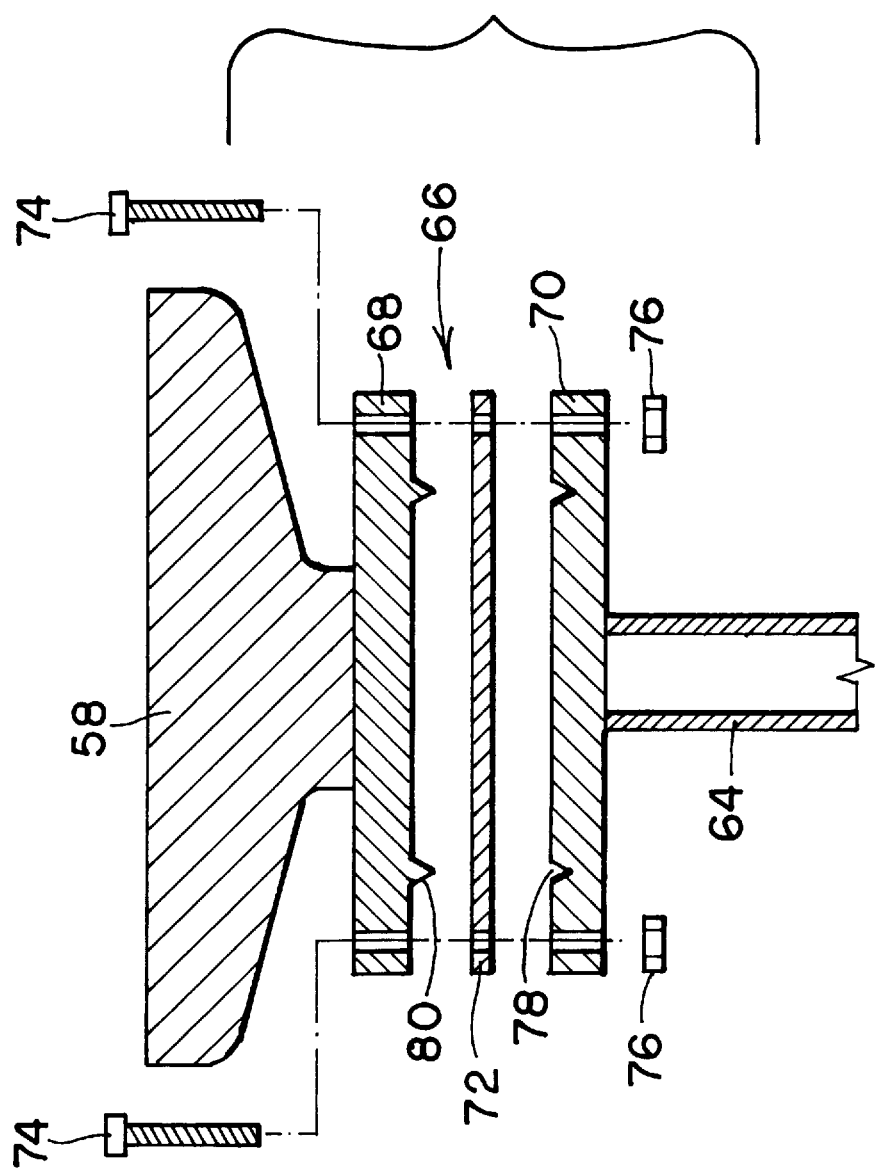

CO-AXIAL MOTORIZED WAFER LIFT

BACKGROUND OF THE INVENTION

The present invention relates to an apparatus for vertically moving and positioning a workpiece, and more particularly to a motorized lifting apparatus for vertically moving and positioning a semiconductor wafer support pedestal within a processing chamber.

In a typical multi-chamber deposition system, a central transfer chamber is surrounded by a plurality of semiconductor processing chambers. A robot is positioned within the central transfer chamber for transferring semiconductor wafers between processing chambers. Process steps carried out within the process chambers include etching, deposition, passivation, etc., where a sealed environment must be maintained in the process chamber to limit the likelihood of contamination and to ensure that various specific processing conditions are provided therein. A valve assembly is positioned between the transfer chamber and each adjacent process chamber to maintain the sealed environment.

Within each processing chamber, a pedestal (also commonly termed a susceptor, substrate support or heater) is provided to support the wafer during processing. The pedestal is generally connected to an upper end of a vertical shaft which extends through a lower wall of the process chamber. A bellows assembly sealingly surrounds a portion of the length of the shaft. The lower end of the bellows assembly is typically connected to a base plate, and a vacuum seal is situated between mating surfaces of the base plate and lower chamber wall to ensure the existence of a sealed environment within the chamber.

The pedestal is typically connected to the vertical shaft by some type of permanent connection, such as welding. At present, the pedestal heater typically wears out much more quickly than the other components of the wafer lift mechanism. Likewise, where a heater is not used, the pedestal surfaces commonly need to be cleaned more frequently than the rest of the system components. On the average, a pedestal will operate for approximately 1500 hours before it must be replaced. In order to replace the pedestal in the currently available systems, it is necessary to break the vacuum seal between the base plate and the lower chamber wall. When the pedestal must be replaced, the entire lift mechanism must be removed and replaced along with the pedestal.

The pedestal may be raised or lowered by actuation of an external drive mechanism. Currently, two types of external drive systems are used: servo-motor drive systems and pneumatic drive systems.

FIG. 1 illustrates a typical example of the conventional prior art servo-motor system which has a pedestal 10 connected to a shaft 12. A base plate 14 surrounds the shaft 12 and seals the opening in the lower chamber wall 20. A bellows assembly 16 is provided within the chamber, and a bearing 18 surrounds the shaft 12, which slides through the bearing as the pedestal is raised or lowered. The external drive mechanism consists of a motor 22 which is offset from the longitudinal axis of the lift mechanism shaft 12. The motor 22 can be virtually any type of servo-motor, such as DC, AC and step motors. The motor is connected, and imparts rotary motion, to a motor pulley 24. The motor pulley 24 is connected to a drive pulley 26 by drive belt 28. The drive pulley 26 threadably engages the lead screw 30 of the shaft 12, such that rotation of the drive pulley 26 via the drive belt 28, causes the pedestal to be raised or lowered. Bearings 32, 34 are positioned on both sides of the drive pulley 26 to guide and limit the movement thereof.

FIG. 2 shows an alternative type of prior art servo-motor driven wafer lift mechanism, wherein like reference numerals indicate like components. The external drive mechanism of the servo-motor system shown in FIG. 2 also consists of a motor 36 which is offset from the longitudinal axis of the lift mechanism shaft 12. A lead screw 38 protrudes from and is rotatably driven by the motor 36 and threadably engages a drive nut 40. As the lead screw 38 rotates, the drive nut 38 moves upwardly or downwardly along the axis of the lead screw, depending upon the direction of rotation. A bearing 42 surrounds at least a portion of the lead screw 38 to maintain alignment of the screw with the nut. The drive nut 40 is connected to the lift mechanism shaft 12 by a drive arm 44, so that vertical movement of the drive nut 40 results in similar vertical movement of the pedestal 10.

A primary advantage of the servo-motor system is that it permits incremental adjustment and positioning of the pedestal within the chamber. However, the offset positioning of the servo-motor increases the footprint of the device. In addition, the torque required to provide movement to the pedestal generates a large side load on the bearing in which the shaft slides. Furthermore, the translation of rotary motion from the motor into linear motion of the pedestal through the belt or drive arm results in slow acceleration and movement of the pedestal.

A pneumatically driven lift mechanism is shown in FIG. 3, wherein like reference numerals also indicate like components. In the typical pneumatic system, an air cylinder 46 and ram 48 may be directly connected to the lower end of the shaft 12 to provide vertical movement of the pedestal 10. Positioning of the pedestal in the chamber is provided by stops which are engaged by complementary logs on the ram 48, thus defining the ram's 48 and pedestal's 10 travel. A disadvantage of the pneumatic system is that it cannot provide incremental movement and positioning of the pedestal within the chamber. The air cylinder may provide only an upper position, with the ram fully extended against an upper stop for example, and a lower position, e.g. with the ram fully contracted against a lower stop.

SUMMARY OF THE INVENTION

The present invention is an apparatus for vertically moving and positioning a workpiece, such as a semiconductor wafer, within a chamber. The present invention overcomes the disadvantages inherent in the prior art by providing a servo-motor drive mechanism which is coaxial with the pedestal drive shaft. This allows for very fast movement and incremental positioning of the pedestal, without side loading on the ram inherent in prior art mechanical systems. The present invention also provides a lift mechanism wherein all or a portion of the pedestal assembly can be removed from the remaining components of the lift mechanism without the need to remove the entire lift mechanism or break the chamber seal where the ram extends through the chamber envelope.

The apparatus according to a first aspect of the invention comprises a pedestal for supporting the article with in the chamber, a shaft extending downwardly from a lower region of the pedestal, and drive means for providing linear vertical translation of the shaft and pedestal. The drive means is co-axial with and surrounds the shaft proximal to a distal portion thereof. The apparatus may further comprise a bearing surrounding the shaft above the drive means, and/or a bellows assembly surrounding the shaft between the drive means and the pedestal.

According to a second aspect of the invention, provided is an apparatus for vertically moving and positioning a workpiece, such as a semiconductor wafer, within a chamber comprising a pedestal for supporting the article within the chamber, a shaft extending downwardly from a lower region of the pedestal, a rotatable hollow shaft motor surrounding the shaft proximal to the distal portion thereof, and a drive flange connected to the shaft motor for drivingly engaging the distal portion of the shaft. The drive flange preferably surrounds the shaft proximal to the distal portion thereof and exhibits threads for rotatably engaging a shaft lead screw formed in the distal portion thereof. The apparatus may further comprise a bearing surrounding the shaft above the drive means, and/or a bellows assembly surrounding the shaft between the drive means and the pedestal.

A pair of substantially flat planar plates removably connected to one another may be provided for connecting the bellows assembly to the pedestal. The upper plate is preferably connected to a lower region of the pedestal and the lower plate is preferably connected to the upper end of the shaft. A metal gasket may be positioned between the upper plate and the lower plate. A lower surface of the upper plate and an upper mating surface of the lower plate may each exhibit a knife edge metal seal. The upper plate and lower plate are preferably removably connected to one another by a plurality of bolts.

The pedestal may further include a heating element therein for heating and cooling a wafer placed on the surface of the pedestal. According to this aspect, the shaft may be a hollow metal cylinder with a plurality of wires and cooling lines passing therethrough and connected to the heating element. A base plate surrounding the shaft at a position between the drive means and the pedestal may be provided to removably connect the apparatus to a lower wall of the chamber.

According to a third aspect of the present invention a lift mechanism for vertically translating a workpiece, such as a semiconductor wafer, within a chamber is provided comprising a pedestal located within the chamber for supporting the article, a pair of substantially flat planar plates removably connected to one another, and an external drive mechanism. An upper one of the pair of plates is connected to a lower region of the pedestal. A shaft is connected to a lower surface of a lower one of the pair of plates and extends downwardly therefrom through a lower wall of the chamber. The external drive mechanism is connected to a distal end of the shaft. The external drive mechanism may be comprised of a rotatable hollow shaft motor proximal to and surrounding the distal portion of the shaft, and a drive flange connected to the rotatable hollow shaft motor and surrounding the shaft proximal to the distal portion thereof. The drive flange exhibits threads for rotatably engaging a shaft lead screw. The lift mechanism may further include a bearing surrounding said shaft above the rotatable hollow shaft motor, and/or a bellows assembly surrounding the shaft between the rotatable hollow shaft motor and the pair of planar plates. A metal gasket may be provided between the upper plate and lower plate, and a lower surface of the upper plate and an upper mating surface of the lower plate may each exhibit a knife edge metal seal. The upper plate and the lower plate may be removably connected to one another by a plurality of bolts.

These and other features, aspects and advantages of the present invention will become better understood by referring to the following detailed description, drawings and claims, wherein examples of the presently preferred embodiments are given for purposes of illustration and disclosure.

BRIEF DESCRIPTION OF THE DRAWINGS

FIG. 5 is an exploded side sectional view of a portion of the wafer lift mechanism shown in FIG. 4.

DETAILED DESCRIPTION

Figure 1:
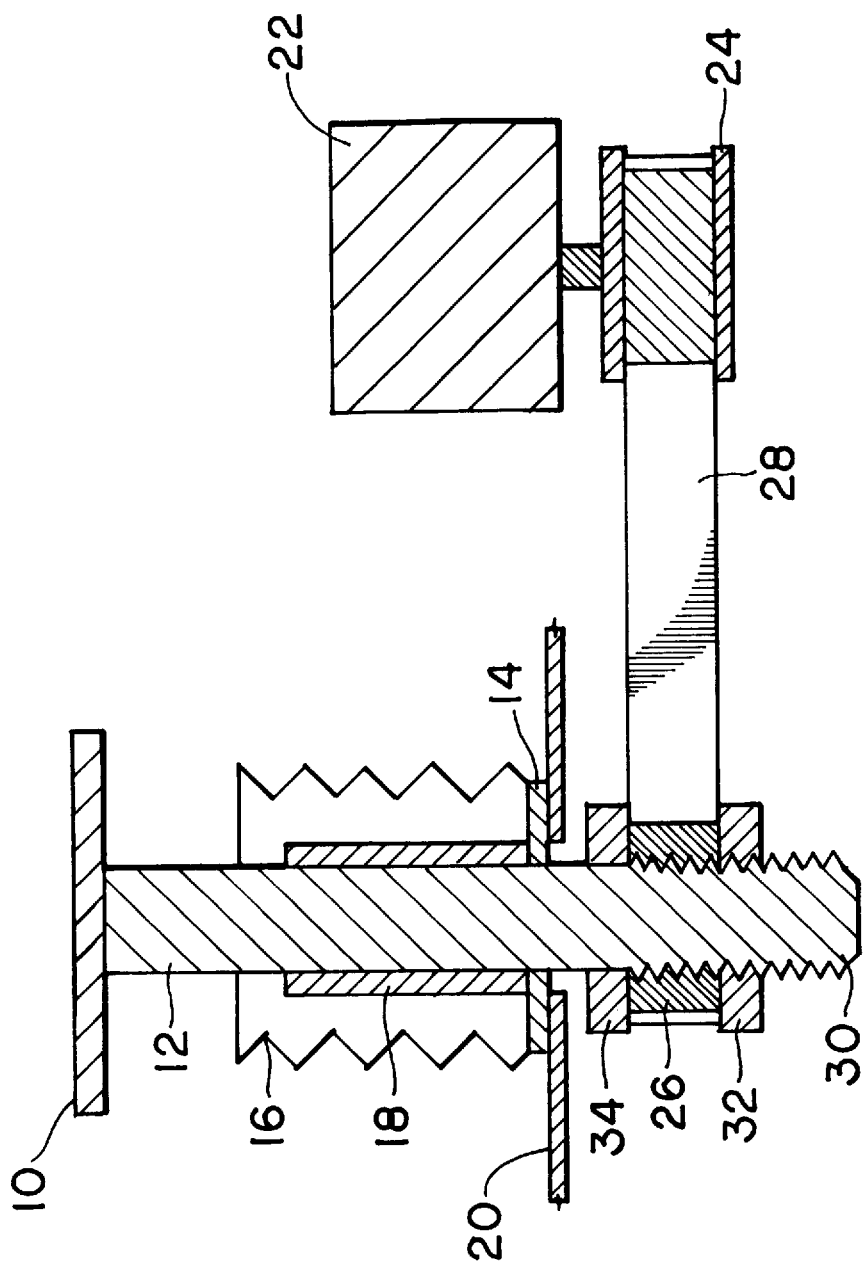
FIG. 1 is a side sectional view of a first prior art wafer lift device.
Figure 2:
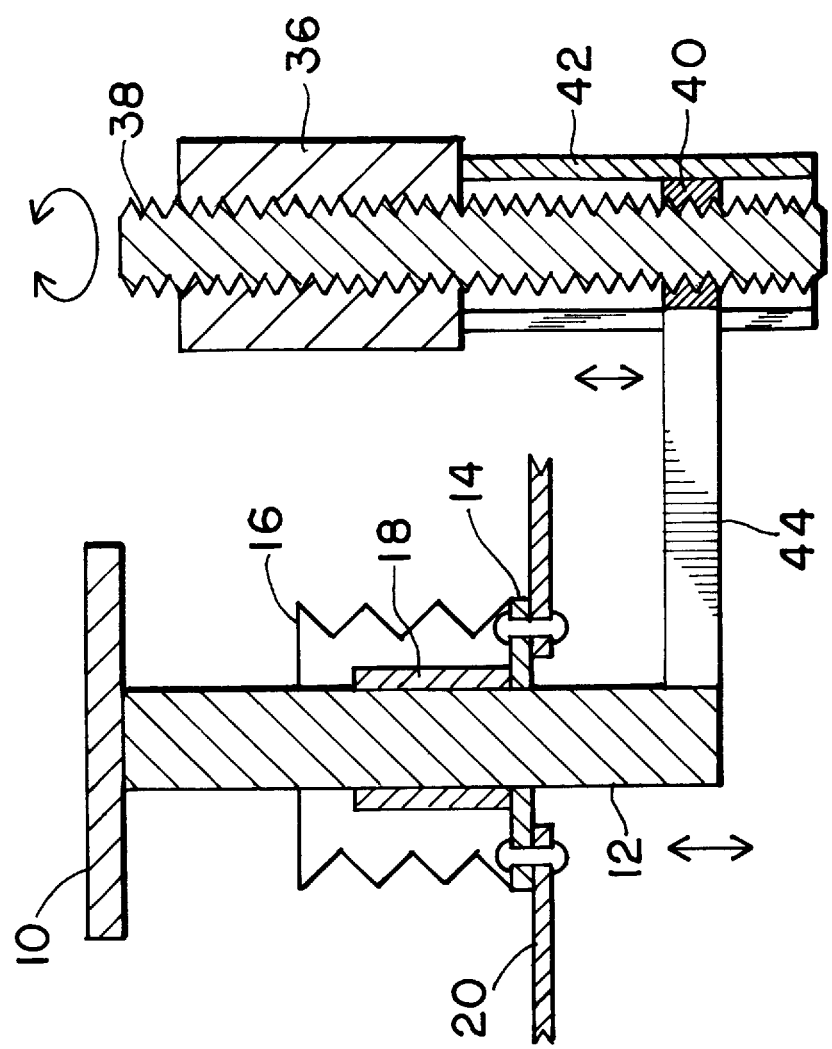
FIG. 2 is a side sectional view of a second prior art wafer lift device.
Figure 3:
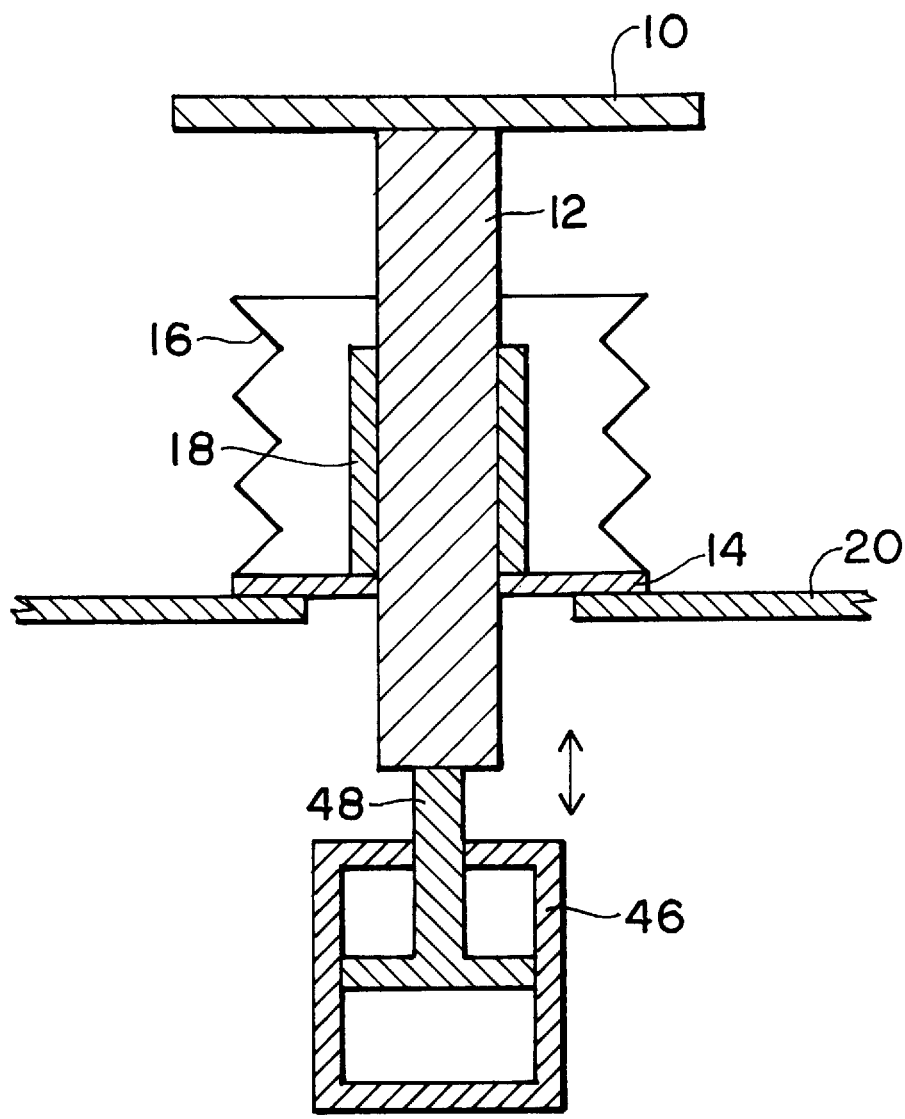
FIG. 3 is a side sectional view of a third prior art wafer lift device.

The present invention is best understood by referring to the Drawings in connection with review of this Description. The present invention is an apparatus for vertically moving and positioning a workpiece, such as a semiconductor wafer, within a chamber comprising a pedestal for supporting the article within the chamber, a shaft extending downwardly from a lower region of the pedestal and exhibiting a lead screw at a distal portion thereof, and drive means for providing linear vertical translation of the shaft and pedestal. The drive means is co-axial with, and preferably surrounds the shaft proximal to the distal portion thereof. Alternatively, the drive means may be located coaxially within the hollow shaft. Also provided is a lift mechanism for vertically translating a workpiece, such as a semiconductor wafer, within a chamber comprising a pedestal located within the chamber for supporting the article, upper and lower substantially flat planar plates removably connected to one another, the upper plate being connected to a lower region of the pedestal, a shaft connected to a lower surface of the lower plate and extending downwardly therefrom through a lower wall of the chamber, and an external drive mechanism connected to a distal end of the shaft.

Figure 4:
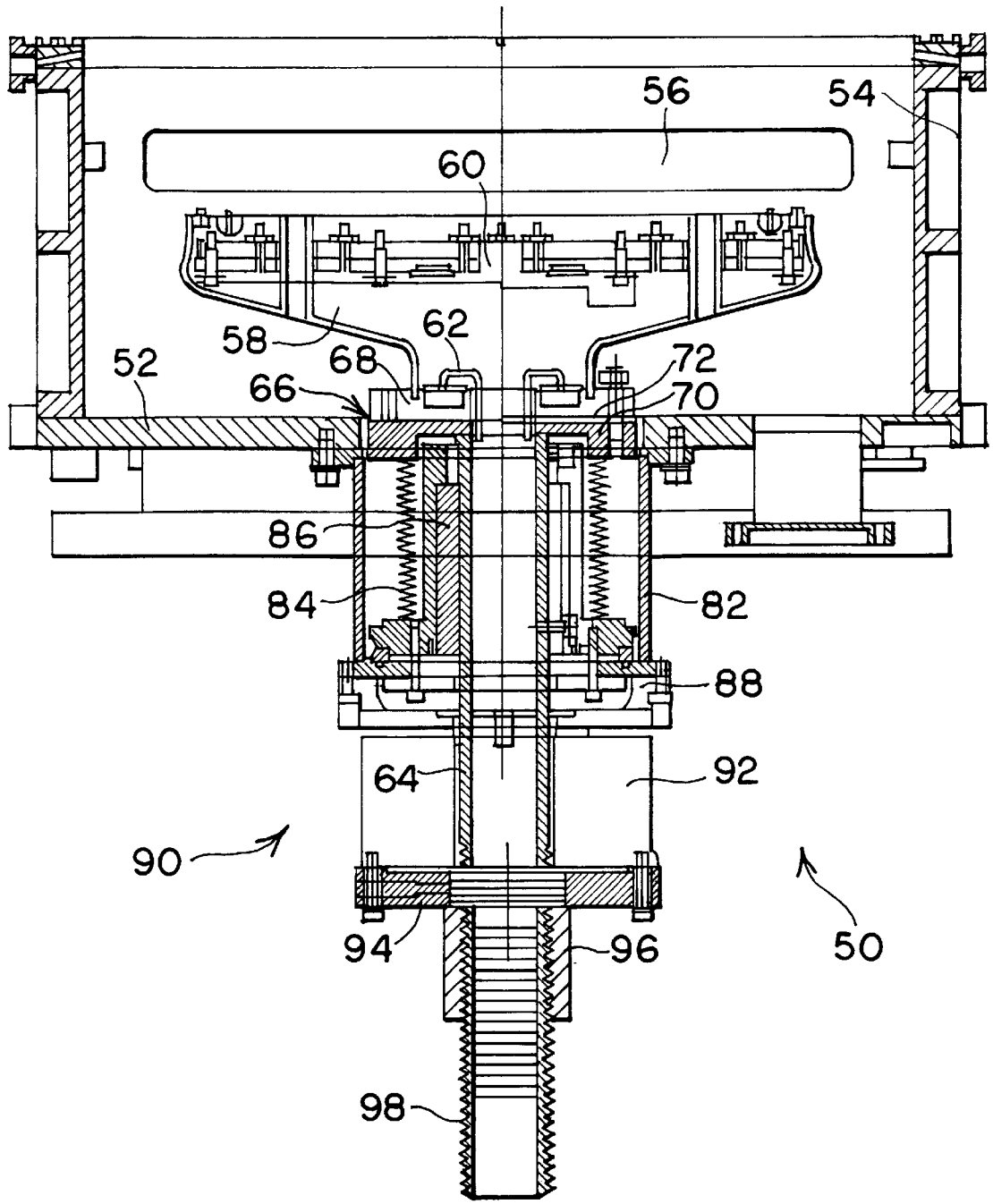
FIG. 4 is a side sectional view of the wafer lift mechanism according to an embodiment of the present invention.

FIG. 4 shows a preferred embodiment of a wafer heating and lifting mechanism 50 according to the present invention. The lifting mechanism is shown extending through the lower wall 52 of a wafer processing chamber 54, in which a slot 56 is provided to insert and remove a semiconductor wafer. A wafer pedestal 58 is located within the chamber 54 for supporting a wafer during processing. The wafer pedestal 58 includes a heater 60, which is used to heat the wafer prior to and/or during processing to ensure, for example, better deposition of a target metal onto the surface of the wafer and into vias in the wafer surface. Heating and cooling tubes 62 are also provided to facilitate heat transfer to and from the heater 60 located within the wafer pedestal 58. For certain applications, it is unnecessary to provide a heater. In such applications, a pedestal is provided without the internal heating apparatus.

The wafer pedestal 58 is connected to the upper end of a drive shaft 64 by a CONFLAT® assembly 66. The drive shaft 64 is hollow to permit the cooling tubes 62, wires and thermocouples to pass therethrough. The CONFLAT® assembly 66 includes an upper flange or plate 68 connected to a lower region of the pedestal 58, and a lower flange or plate 70 connected to the upper end of the hollow drive shaft 64. A gasket 72 is disposed between the upper and lower plates to provide a seal therebetween. The gasket is preferably formed from a malleable metal, such as aluminum. The upper plate 68, gasket 72 and lower plate 70 are held together by a plurality of bolts 74 and nuts 76 which are positioned along the periphery thereof to removably connect the upper plate to the lower plate. In this way, a pedestal can be removed and a new pedestal installed without removing the entire lift assembly.

As shown in FIG. 5, the CONFLAT® assembly 66 also includes a circumferential knife edge seal, which includes a knife edge 80 located in either the upper or lower plate and a corresponding groove 78 located in the other plate. FIG. 5 shows a knife blade 80 extending from a surface of the upper plate 68 with a corresponding groove 78 in the mating upper surface of the lower plate 70. The knife edge may be reversed, or a plurality of knife edge seals may be present in any configuration to ensure a proper seal between the vacuum environment of the process chamber 54 and the interior of the lift mechanism 50. The knife edge seal deforms the gasket to create such a seal between the two environments.

The wafer heating and lifting mechanism 50 is attached to the lower wall 52 of the process chamber 54 by a mounting assembly 82. A bearing 86 surrounds the drive shaft 64 within the mounting assembly 82 to facilitate vertical movement of the shaft through the mounting assembly and to compensate for side loads and torque placed on the shaft as it moves up and down. A bellows assembly 84 surrounds the bearing 86 and drive shaft in the region of the bearing to separate the process chamber environment from the bearing assembly. A lower flange 88 is connected to the lower region of the mounting assembly 82 and sealingly surrounds the drive shaft. The bellows 84 are attached at an upper end to the lower region of the lower plate 70 and at a lower end thereof to the lower flange 88 to completely seal the bearing assembly from the process chamber environment.

The drive mechanism 90 of the wafer heating and lifting apparatus 50 is co-axial with the hollow drive shaft 64. The drive mechanism 90 includes a drive motor 92 which surrounds the drive shaft 64. The drive motor 92 is preferably a standard AC, DC or step servo-motor. Alternatively, magnetic or electromagnetic motors may be used depending upon the system requirements. Upon actuation, the drive motor rotates about the drive shaft. The drive motor 90 is connected to a drive flange 94 which includes a threaded drive nut 96. The threads of the threaded nut 96 engage threads of a lead screw 98 portion of the hollow shaft 64. As the motor 92 is activated, the motor, drive flange 94 and threaded drive nut 96 rotate about the shaft. The shaft remains fixed in theta, i.e., against rotation, and as the drive mechanism rotates, the drive shaft moves vertically due to the threaded connection between the lead screw 98 and drive nut 96. The shaft may be fixed against rotation by a variety of mechanisms. For example, a longitudinal groove may be formed in the shaft with a projection from a surrounding fixed surface extending into the groove to prevent rotation of the shaft. Rotation of the drive mechanism 90 is one direction, for example clockwise, results in vertical movement, i.e. upward, of the drive shaft, while rotation of the drive mechanism in the opposite direction, i.e. counterclockwise, results in vertical movement of the drive shaft in the opposite, or downward, direction.

In the preferred implementation of the invention, the pedestal 58 cooperates with a plurality of lift pins (not shown) which extend through apertures in the pedestal 58 and which are separately actuable to enable placement of the substrate or wafer thereon, and are moveable, with respect to the pedestal 58, to enable placement of the substrate on the pedestal or lifting of the substrate off of the pedestal. Alternatively, the invention may be used in conjunction with a lift hoop or lift fingers disposed about the perimeter of the pedestal 58, which hoop or fingers are likewise actuable independently of the pedestal 58 to enable positioning of a substrate thereon by a robot or other mechanism, and placement of the substrate on, or removal of the substrate from, the pedestal 58 by relative movement of the pedestal and hoop/fingers. The use, structure and operation of such pins, hoops and fingers are well known expedients to those skilled in the art.

The present invention, therefore, is well adapted to carry out the objects and attain the ends and advantages mentioned as well as others inherent therein. While presently preferred embodiments of the invention are given for the purpose of disclosure, numerous changes in the details will readily suggest themselves to those skilled in the art and which are encompassed within the spirit of the invention and the scope of the appended claims.

I claim:

1. An apparatus for vertically moving and positioning a wafer within a chamber comprising:

a pedestal for supporting the wafer within the chamber;

a shaft extending downwardly from a lower region of the pedestal;

a hollow shaft motor surrounding said shaft proximal to a distal portion thereof; and a drive means connected to said shaft motor for drivingly engaging the distal portion of said shaft.

2. The apparatus according to claim 1, wherein said drive means surrounds said shaft proximal to said distal portion thereof and includes threads for rotatably engaging a lead screw formed in the distal portion of said shaft.

3. The apparatus according to claim 2, further comprising a bearing surrounding said shaft above said hollow shaft motor.

4. The apparatus according to claim 2, further comprising a bellows assembly surrounding said shaft between said hollow shaft motor and said pedestal.

5. The apparatus according to claim 4, further comprising means for removably connecting said bellows assembly to said pedestal.

6. The apparatus according to claim 5, wherein said removable connecting means comprises a pair of substantially flat planar plates removably connected to one another; an upper plate being connected to a lower region of the pedestal, and a lower plate being connected to the upper end of said shaft.

7. The apparatus according to claim 6, wherein said removable connecting means further comprises a metal gasket between said upper plate and said lower plate.

8. The apparatus according to claim 7, wherein a lower surface of said upper plate and an upper mating surface of the lower plate exhibit a knife edge metal seal.

9. The apparatus according to claim 6, wherein said upper plate and said lower plate are removably connected to one another by a plurality of bolts.

10. The apparatus according to claim 1, wherein said pedestal includes a heating element.

11. The apparatus according to claim 10, wherein said shaft is a hollow metal cylinder.

12. The apparatus according to claim 11, further comprising a plurality of wires and cooling lines connected to said heating element and passing through said hollow metal cylinder.

13. The apparatus according to claim 1, further comprising a base plate surrounding said shaft at a position between said drive means and said pedestal, said base plate being removably connected to a lower wall of the chamber.

14. A co-axial motorized wafer lift mechanism for vertically translating a wafer within a chamber comprising:

a pedestal located within the chamber for supporting the wafer;

a pair of substantially flat planar plates removably connected to one another; an upper plate being connected to a lower region of the pedestal;

a shaft connected to a lower surface of a lower one of said pair of plates; said shaft extending downwardly therefrom through a lower wall of said chamber; and an external drive mechanism connected to a distal end of said shaft.

15. The lift mechanism according to claim 14, wherein said external drive mechanism comprises:

a hollow shaft motor surrounding said shaft proximal to said distal portion thereof; and a drive flange connected to said hollow shaft motor and surrounding said shaft proximal to said distal portion thereof, said drive flange including threads for rotatably engaging a lead screw formed in the distal portion of said shaft.

16. The lift mechanism according to claim 15, further comprising a bearing surrounding said shaft above said hollow shaft motor.

17. The lift mechanism according to claim 15, further comprising a bellows assembly surrounding said shaft between said hollow shaft motor and said pair of substantially flat planar plates.

18. The lift mechanism according to claim 14, further comprising a metal gasket between said upper plate and said lower plate.

19. The lift mechanism according to claim 18, wherein a lower surface of said upper plate and an upper mating surface of the lower plate exhibit a knife edge metal seal.

20. The lift mechanism according to claim 14, wherein said upper plate and said lower plate are removably connected to one another by a plurality of bolts.

* * * * *